(12) United States Patent
Min et al.

(10) Patent No.: US 9,688,051 B2
(45) Date of Patent: Jun. 27, 2017

(54) WINDOW MEMBER AND IMAGE DISPLAY APPARATUS INCLUDING THE SAME

(71) Applicant: Samsung Display Co., Ltd., Yongin (KR)

(72) Inventors: Gui Nam Min, Hwaseong-si (KR); Kyu taek Lee, Yongin-si (KR); Kyung Woo Han, Yongin-si (KR); Soyeon Han, Yongin-si (KR); Kyu-young Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 177 days.

(21) Appl. No.: 14/094,143

(22) Filed: Dec. 2, 2013

(65) Prior Publication Data

US 2015/0024170 A1 Jan. 22, 2015

(30) Foreign Application Priority Data

Jul. 17, 2013 (KR) .................. 10-2013-0084274

(51) Int. Cl.
| | |
|---|---|
| *B32B 3/26* | (2006.01) |
| *H01L 51/00* | (2006.01) |
| *H01L 27/32* | (2006.01) |
| *H01L 51/52* | (2006.01) |
| *G02F 1/1333* | (2006.01) |

(52) U.S. Cl.
CPC .............. *B32B 3/263* (2013.01); *H01L 27/32* (2013.01); *H01L 51/0097* (2013.01); *H01L 51/5256* (2013.01); *G02F 1/13338* (2013.01); *G02F 2001/133331* (2013.01);
(Continued)

(58) Field of Classification Search
CPC ..... B32B 3/263; H01L 27/32; H01L 51/0097; H01L 51/5256; H01L 51/524; G02F 1/13338; G02F 2001/133331; G02F 2201/50; Y02E 10/549; Y10T 428/24612
USPC ..... 428/212–220, 141, 156–173, 201, 195.1, 428/198
See application file for complete search history.

(56) References Cited

U.S. PATENT DOCUMENTS

| 2003/0087054 A1 | 5/2003 | Janssen et al. |
| 2008/0055831 A1* | 3/2008 | Satoh ................ G02F 1/133305 |
| | | 361/600 |

(Continued)

FOREIGN PATENT DOCUMENTS

| EP | 1 830 336 | 9/2007 |
| EP | 2 348 789 | 4/2013 |

(Continued)

OTHER PUBLICATIONS

Extended European Search Report dated Mar. 31, 2015, in European Patent Application No. 14157296.6.

*Primary Examiner* — Maria Veronica Ewald
*Assistant Examiner* — Travis Figg
(74) *Attorney, Agent, or Firm* — H.C. Park & Associates, PLC

(57) ABSTRACT

A window member includes flexible base films and a protective film. The flexible base films are stacked upon one another. Each flexible base film is substantially transparent. The protective film is disposed on the flexible base films and is substantially transparent. Each of the flexible base films includes protrusions and grooves disposed between adjacent protrusions. Corresponding protrusions of the flexible base films at least partially overlap one another.

15 Claims, 12 Drawing Sheets

(52) U.S. Cl.
CPC ........ *G02F 2201/50* (2013.01); *H01L 51/524* (2013.01); *Y02E 10/549* (2013.01); *Y10T 428/24612* (2015.01)

(56) References Cited

U.S. PATENT DOCUMENTS

| | | | |
|---|---|---|---|
| 2008/0100562 A1* | 5/2008 | Huang et al. | 345/102 |
| 2010/0013786 A1 | 1/2010 | Nishikawa et al. | |
| 2010/0033442 A1* | 2/2010 | Kusuda | G06F 3/045 345/173 |
| 2011/0013112 A1 | 1/2011 | Yaguchi et al. | |
| 2011/0297220 A1* | 12/2011 | Rinko | B32B 38/06 136/256 |
| 2012/0262660 A1 | 10/2012 | Fujiwara et al. | |

FOREIGN PATENT DOCUMENTS

| | | |
|---|---|---|
| JP | 2012-132985 | 7/2012 |
| JP | 2012-176624 | 9/2012 |
| KR | 10-2010-0014857 | 2/2010 |

\* cited by examiner

WINDOW MEMBER AND IMAGE DISPLAY APPARATUS INCLUDING THE SAME

CROSS-REFERENCE TO RELATED APPLICATION

This application claims priority from and the benefit of Korean Patent Application No. 10-2013-0084274, filed on Jul. 17, 2013, which is incorporated by reference for all purposes as if set forth herein.

BACKGROUND

Field

Exemplary embodiments relate to display technology, and, more particularly, to a window member and an image display apparatus including the same.

Discussion

Various electronic devices, such as smart phones, digital cameras, notebook computers, navigation devices, smart televisions, etc., typically include an image display apparatus to display an image. The image display apparatus may include a display panel to generate and display the image and a window member disposed on the display panel to protect the display panel. The display panel may be, for example, a liquid crystal display (LCD) panel, an organic light emitting display (OLED) panel, a plasma display (PD) panel, a field emission display (LED) panel, an electrowetting display (EWD) panel, an electrophoretic display (EPD) panel, etc. To facilitate user interaction, the display panel may include (or otherwise be associated with) a "touch" input function. For instance, smart phones typically include a touch panel disposed on the display panel to facilitate user interaction. In this manner, an input signal generated by a touch interaction may affect information displayed via the display panel, as well as act as an external force applied to the display panel. Over time the application of the external forces may affect the performance of the display panel.

Advancements in materials and technology have brought forth developments in flexible display panels. Typically, a flexible display panel is formed of a plastic material that is sufficiently pliable to promote the flexibility of the display panel.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a window member configured to protect a display panel from external forces and maintain a sufficient level of flexibility.

Exemplary embodiments provide an image display apparatus including the window member.

Additional aspects will be set forth in the detailed description which follows and, in part, will be apparent from the disclosure, or may be learned by practice of the inventive concept.

According to exemplary embodiments, a window member includes: flexible base films stacked upon one another, each flexible base film being substantially transparent; and a protective film disposed on the flexible base films, the protective film being substantially transparent. Each of the flexible base films includes protrusions and grooves disposed between adjacent protrusions. Corresponding protrusions of the flexible base films at least partially overlap one another.

According to exemplary embodiments, a display apparatus includes: a display panel to display an image; and a window member disposed on the display panel. The window member includes: flexible base films stacked upon one another, each flexible base film being substantially transparent; and a protective film disposed on the flexible base films, the protective film being substantially transparent. Each of the flexible base films includes protrusions and grooves disposed between adjacent protrusions. Corresponding protrusions of the flexible display films at least partially overlap one another.

According to exemplary embodiments, a display apparatus includes: a display panel to display an image; a stack of flexible films disposed on the display panel, each of the flexible films includes a main portion and a pattern of protrusions extending from the main portion; and a protective film disposed on the stack of flexible films. The respective patterns of protrusions substantially overlap one another.

According to exemplary embodiments, the window member and the image display apparatus may protect a display panel from external forces and maintain a sufficient level of flexibility.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept and are incorporated in and constitute a part of this specification, illustrate exemplary embodiments of the inventive concept, and together with the description serve to explain principles of the inventive concept.

DETAILED DESCRIPTION OF THE ILLUSTRATED EMBODIMENTS

Figure 1:
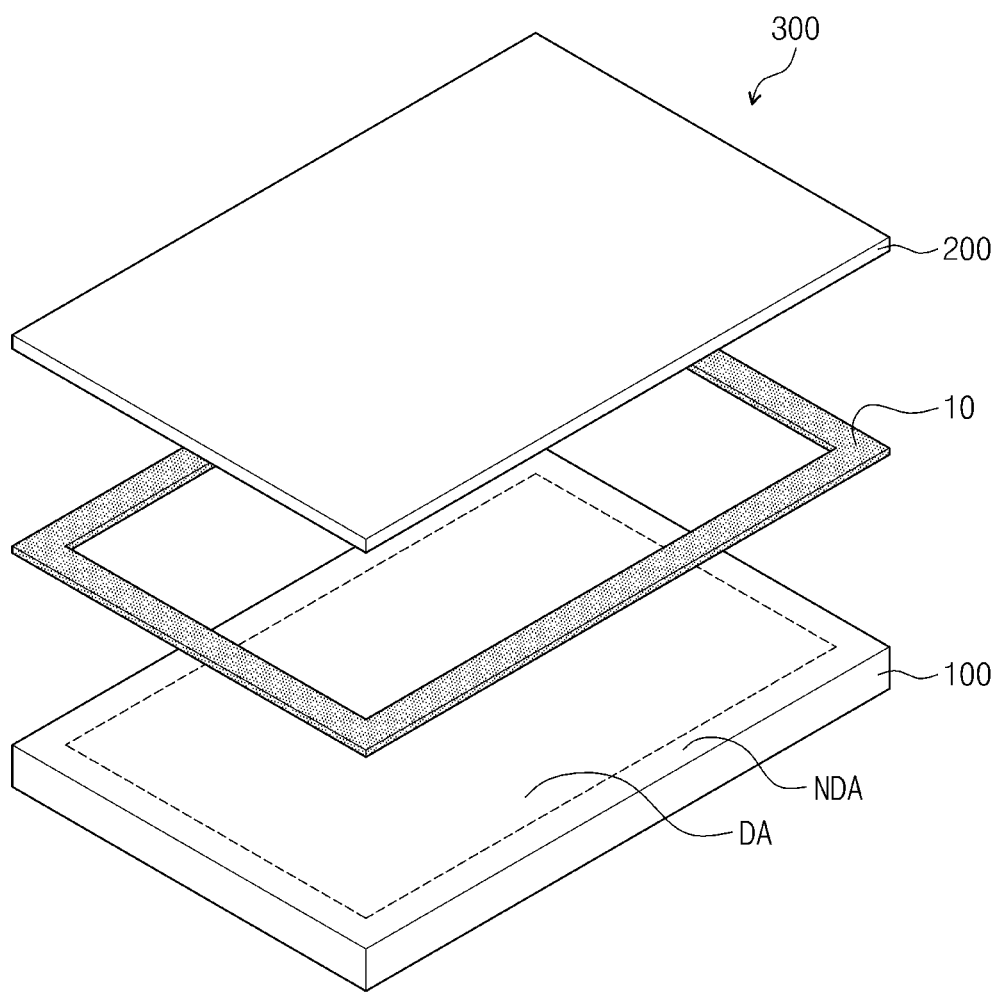
FIG. 1 is an exploded perspective view of an image display apparatus, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
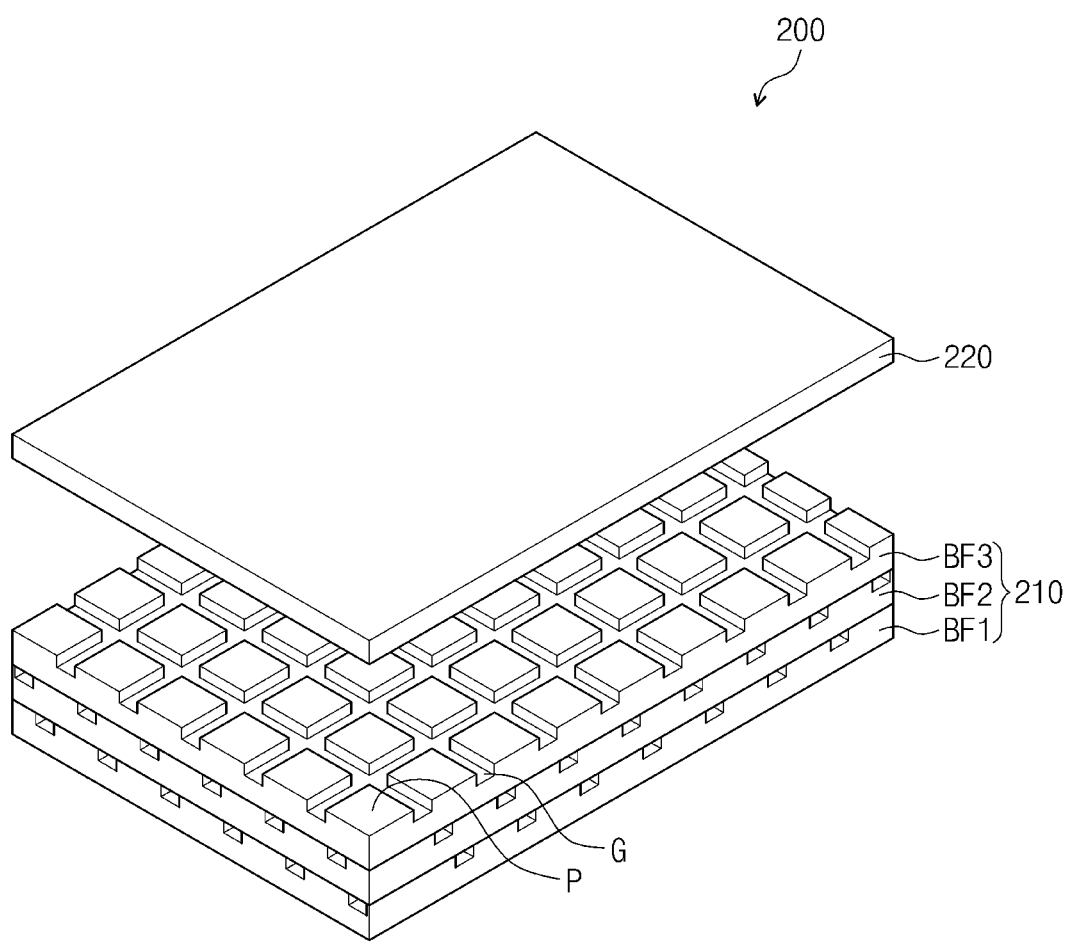
FIG. 2 is an exploded perspective view of a window member of the image display apparatus of FIG. 1, according to exemplary embodiments.

FIG. 1 is an exploded perspective view of an image display apparatus, according to exemplary embodiments. FIG. 2 is an exploded perspective view of a window member of the image display apparatus of FIG. 1.

Referring to FIG. 1, the image display apparatus 300 may include a display panel 100, a window member 200 disposed on the display panel 100, and a decoration printed layer 10 disposed between the display panel 100 and the window member 200. Although specific reference will be made to this particular implementation, it is also contemplated that the image display apparatus 300 may embody many forms and include multiple and/or alternative components.

The display panel 100 is configured to generate an image. The display panel 100 may include a display area DA and a non-display area NDA, which may be disposed adjacent to (or otherwise outside of) the display area DA. For instance, the non-display area NDA may surround the display area DA. In exemplary embodiments, an image presented to an observer may be displayed in the display area DA and either not displayed or not viewable in the non-display area NDA.

According to exemplary embodiments, the image display apparatus 300 may be, for example, a flexible image display apparatus; however, it is contemplated that any suitable image display apparatus may be utilized. For instance, the display panel 100 may be formed of a plastic substrate (not shown) that is sufficiently pliable as to be considered a flexible display substrate. Although not shown in figures, a plurality of pixels may be formed on the plastic substrate and may be configured to display the image. For instance, the plurality of pixels may be disposed in the display area DA to enable the display of an image in the display area DA.

The window member 200 may be transparent or at least translucent. In this manner, an image generated by the display panel 100 may be viewed by an observer after passing through the window member 200. To this end, the window member 200 may be disposed on the display panel 100, and, thereby, configured to protect the display panel 100 from, for example, external forces and/or contaminants, e.g., dust, debris, gasses, etc.

In exemplary embodiments, the decoration printed layer 10 may be disposed between the display panel 100 and the window member 200. Further, the decoration printed layer 10 may be disposed in correspondence with the non-display area NDA of the display panel 100. The decoration printed layer 10 may be a determined color. For instance, the decoration printed layer 10 may be a black color, but it is contemplated that any other suitable color may be utilized, e.g., a white color, a red color, a gray color, a green color, a blue color, etc., and/or combinations thereof. Since the window member 200 may be transparent or at least translucent, the color of the decoration printed layer 10 may be viewed in the non-display area NDA.

Referring to FIG. 2, the window member 200 may include a plurality of base films 210 stacked upon one another and a protective film 220 disposed on the base films 210. It is noted that the protective film 220 may be transparent or at least translucent.

According to exemplary embodiments, the base films 210 may be formed of any suitable material, such as, for example, a polymer resin that is sufficiently flexible and transparent or at least translucent. For instance, the base films 210 may be a polyimide (PI) film, a poly(methyl methacrylate) (PMMA) film, a tri-acetyl-cellulose (TAC) film, etc., and/or combinations thereof. Each of the base films 210 may include protrusions P and grooves G formed between the protrusions P. The protrusions P disposed in different ones of the base films 210 may overlap one another. That is, the protrusions P arranged on different layers may at least partially overlap one another. As seen in FIG. 2, each of the protrusions P has a rectangular shape in a plan view; however, it is contemplated that any other suitable geometric configuration may be utilized.

In exemplary embodiments, the base films 210 may include a first base film BF1, a second base film BF2 disposed on the first base film BF1, and a third base film BF3 disposed on the second base film BF2. In this manner, the second base film BP2 may be disposed between the first base film BF1 and the third base film BF3. The protrusions P of the first base film BF1, the protrusions P of the second base film BF2, and the protrusions P of the third base film BF3 are disposed overlapping one another. It is contemplated, however, that not all of the protrusions may overlap one another. Further, although three base films 210 are shown in FIG. 2, it is contemplated that any suitable number of base films 210 may be utilized, such as one or more base films.

Figure 3:
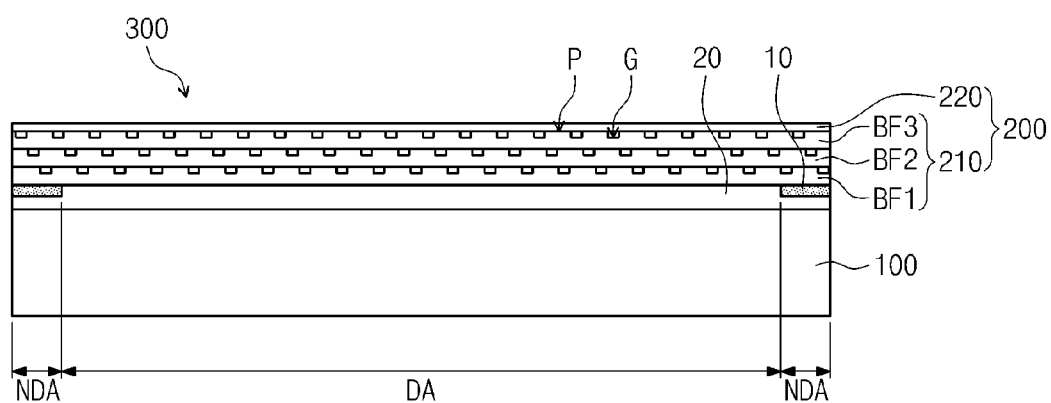
FIG. 3 is a cross-sectional view of the image display apparatus of FIG. 1, according to exemplary embodiments.

FIG. 3 is a cross-sectional view of the image display apparatus of FIG. 1, according to exemplary embodiments.

Referring to FIG. 3, an adhesive member 20 may be disposed on the display panel 100. To this end, the decoration printed layer 10 and the window member 200 may be disposed on the adhesive member 20. As such, the decoration printed layer 10 may be disposed between the window member 200 and the adhesive 20 in an area corresponding to the non-display area NDA of the display panel 100. In exemplary embodiments, the display panel 100 may be coupled (or otherwise attached) to the decoration printed layer 10 and the window member 200 via the adhesive member 20. The adhesive member 20 may be an optically clear adhesive (OCA); however, any other suitable adhesive may be utilized. It is also contemplated that any other suitable coupling mechanism may be utilized, such as mechanical fasteners, chemical bonding agents, etc.

As described above, the base films 210 of the window member 200 may be stacked upon one another and the protective film 220 may be disposed on the base films 210. In this manner, the second base film BF2 may be disposed on the first base film BF1, the third base film BF3 may be disposed on the second base film BF2, and the protective film 220 may be disposed on the third base film BF3. As such, the protrusions P of the first, second, and third base films BF1, BF2, and BF3 may at least partially overlap one another. In other words, determined areas of the protrusions P of the first, second, and third base films BF1, BF2, and BF3 may overlap one other.

It is noted that when a flat base film (i.e., a base film not including the protrusions P) is disposed on the display panel 100, the image display apparatus 300 may be vulnerable to external forces, e.g., external impacts, piercing forces, etc. For instance, the image display apparatus 300 may be damaged by a sharp object when a window member including one flat base film is utilized. That is, a window member including one flat base film may be vulnerable to piercing forces by the sharp object, and, as such, the display panel 100 may be damaged. In addition, when an object of sufficient weight is dropped on the image display apparatus 300, the external impact applied to the window member including one flat base film may be applied to the display panel 100 substantially the same as it is applied to the window member. That is, the window member including one flat base film may be vulnerable to the external impact, and, may substantially transfer the force of the external impact to the display panel 100, which may be damaged as a result of the transferred force.

The window member 200, according to exemplary embodiments, however, may include the base films 210 stacked upon one another to protect the display panel 100. The increased thickness of the window member 200 (as compared to the window member including one flat base film) may provide a more durable barrier. That is, when the thickness of the window member 200 is increased, a resistance of the window member 200 against piercing forces may be enhanced. In other words, the window member 200 may protect the display panel 100 from the piercing force and damage.

In exemplary embodiments, since each of the base films 210 may include the grooves G formed between the protrusions P, a determined amount of void space may exist in each base film layer. The void space defined by the grooves G in each of the base films 210 may absorb forces associated with external impacts. In this manner, the window member 200, according to exemplary embodiments, may dampen (or otherwise distribute) forces associated with external impacts to the grooves G, which may stop (or reduce) the transfer of the forces to the underlying display panel 100. This may serve to protect the display panel 100 from external impacts and damage.

According to exemplary embodiments, the window member 200 and the image display apparatus 300 including the window member 200 may protect the display panel 100 from external forces and/or contaminants. This may also serve to prevent the display panel 100 from being damaged, and, thereby, increase the life-span of the display panel 100.

Figure 4A:
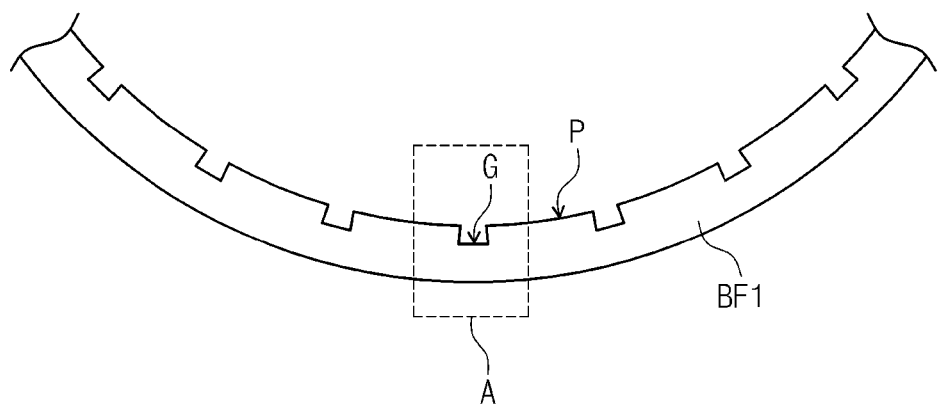
FIG. 4A is a partial cross-sectional view of a bent base film of the image display apparatus of FIG. 3, according to exemplary embodiments.
Figure 4B:
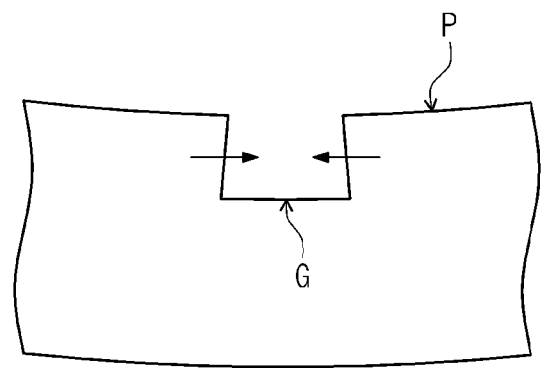
FIG. 4B is a partial enlarged view of portion A of the bent base film of FIG. 4A, according to exemplary embodiments.

FIG. 4A is a partial cross-sectional view of a bent base film of the image display apparatus of FIG. 3, according to exemplary embodiments. FIG. 4B is a partial enlarged view of portion A of the bent base film of FIG. 4A. To avoid obscuring exemplary embodiments described herein, FIGS. 4A and 4B are described in association with the first base film BF1 as a representative base film of the base films 210. In other words, the configuration and effects of each of the first, second, and third base films BF1, BF2, and BF3 may be substantially similar to those described in association with the first base film BF1.

Referring to FIGS. 4A and 4B, when the first base film BF1 is bent in the illustrated manner, deformation of the first base film BF1 causes the protrusions P to be displaced (or otherwise moved) towards the void spaces associated with grooves G. That is, the grooves G provide void spaces, which may become narrowed by the protrusions P, e.g., deformed portions of the protrusions P resulting from the bending moment. In this manner, the flexibility of the first base film BF1 may be increased, as may be the ability of the first base film BF1 to absorb and dampen energy associated with a force causing the bending moment. It is noted that the energy may be laterally transferred in the base film BF1, and, thereby, absorbed by the first base film BF1, which may cause the deformation of the protrusions P. As such, an underlying display panel 100 may be protected. The level of protection may increase with the addition of one or more other base films, such as the second base film BF2 and the third base film BF3.

When, however, flat base films, which do not include the protrusions P, are stacked upon one another, the flexibility of the window member is lowered. That is, when flat base films are stacked upon one another in order to improve resistance against external forces, the flexibility of the corresponding window member may be lowered more than when the window member includes one base film.

According to exemplary embodiments, however, each of the base films 210 of the window member 200 includes the grooves G formed between the protrusions P. In this manner, when the base films 210 are bent, the deformation of the protrusions P may at least partially narrow the void spaces associated with the grooves G in each of the base films 210. As such, the flexibility of the window member 200 may be at least maintained even when the window member 200 is configured with multiple base films 210, which may increase the protection provided by the window member 200 against external forces.

Figure 5:
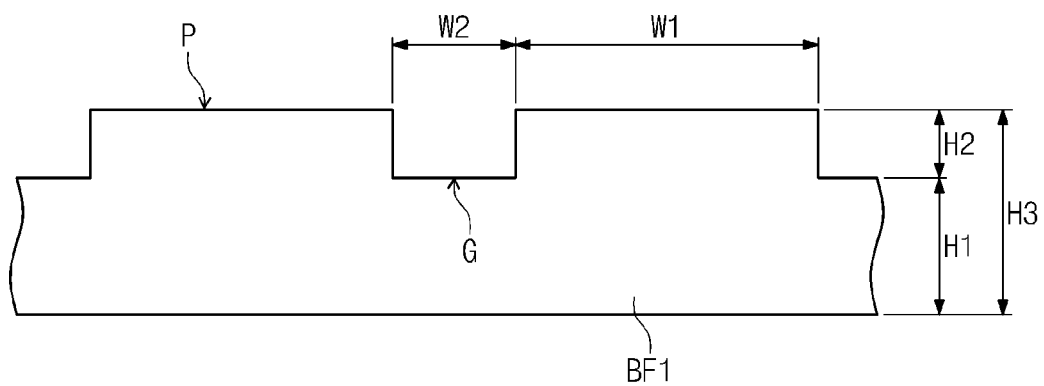
FIG. 5 is a partial enlarged view of a protrusion and a groove formed in the image display apparatus of FIG. 3, according to exemplary embodiments.

FIG. 5 is a partial enlarged view of a protrusions and a groove formed in a base film of the image display apparatus of FIG. 3, according to exemplary embodiments. For illustrative and descriptive convenience, two protrusions P and one groove G of the first base film BF1 are shown and described in association with FIG. 5. It is noted, however, that the second and third base films BF2 and BF3, as well as the other protrusions P and grooves G of the first, second, and third base films BF1, BF2, and BF3 may be substantially the same. It is also contemplated that the configuration of the protrusions P and the grooves G may be varied according to spatial position, whether on a particular base film or between the base films.

Referring to FIG. 5, a height (or dimension) between a bottom surface of the first base film BF1 and a bottom surface of the groove G may be a first height (or distance) H1, and a height between the bottom surface of the groove G and an upper surface of the protrusion P may be a second height H2. In this manner, the overall thickness or height of the first base film BF1 may be a third height H3, which may be equal to the sum of the first and second heights H1 and H2. In addition, a width (or dimension) between lateral side edges (e.g., left and right portions) of the protrusion P may be a first width (or distance) W1, and a width between lateral side edges (e.g., left and right portions) of the groove G may be a second width W2. According to exemplary embodiments, a ratio of the first height H1, the second height H2, the first width W1, and the second width W2 may be 1.00:0.25~0.50:1.00~5.00:0.50~1.50.

As previously mentioned, a height between the bottom surface of the first base film BF1 and the upper surface of the protrusion P may be a third height H3, which corresponds to the thickness of the protrusion P. As shown in FIG. 5, the third height H3 is larger than the first height H1. As an example, the first height H1 may be greater than or equal to about 50 micrometers and smaller than the third height H3, and the third height H3 may be equal to or smaller than about 200 micrometers. In exemplary embodiments, the first height H1, the second height H2, the first width W1, and the second width W2 may be respectively set at about 50 micrometers, about 12.5 micrometers, about 125 micrometers, and about 62.5 micrometers, respectively. In this manner, the third height H3 may be set as about 62.5 micrometers. It is contemplated, however, that any other suitable dimensions may be utilized and/or varied between respective protrusions P and grooves G and/or respective base films.

FIGS. 6 to 10 are respective plan views of various shapes of the protrusion portions of the base films of the image display apparatus of FIG. 3, according to exemplary embodiments. For illustrated and descriptive convenience, FIGS. 6 to 10 provide a depiction of a representative base film BF. In other words, one or more of the first, second, and third base films BF1, BF2, and BF3 may be configured as provided in one or more of FIGS. 6 to 10. It is also noted that the base films 210 may include combinations of differently shaped protrusions P and grooves G in various areas of the corresponding base films 210. For instance, one or more of the representative base films BF illustrated in FIGS. 6 to 10 may be combined in various areas to provide varying levels of flexibility and/or resistance to external forces.

Figure 6:
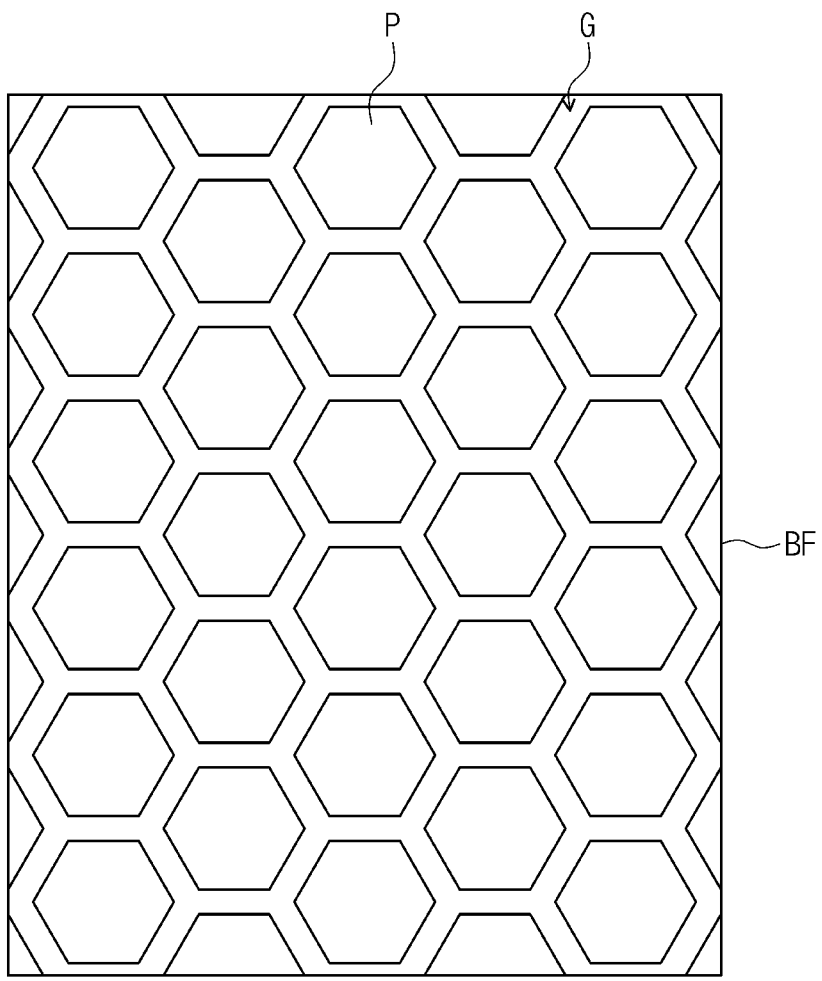
FIGS. 6 to 10 are respective plan views of various shapes of the protrusion portion of the base film, according to exemplary embodiments.

Referring to FIG. 6, each of the protrusions P of the representative base film BF may have a hexagonal shape in a plan view. The protrusions P disposed at a boundary of the representative base film BF may have a triangular shape in a plan view or a trapezoidal shape in a plan view. In this manner, the protrusions P disposed at a boundary may be surrounded by the protrusions P having the hexagonal shape in a plan view. The groove(s) G may be formed between the protrusions P. Although partial protrusions P are shown disposed at boundaries of the representative base film BF, it is also contemplated that the protrusions P and grooves G may be formed so that whole protrusions P are formed at one or more of the boundaries.

Figure 7:
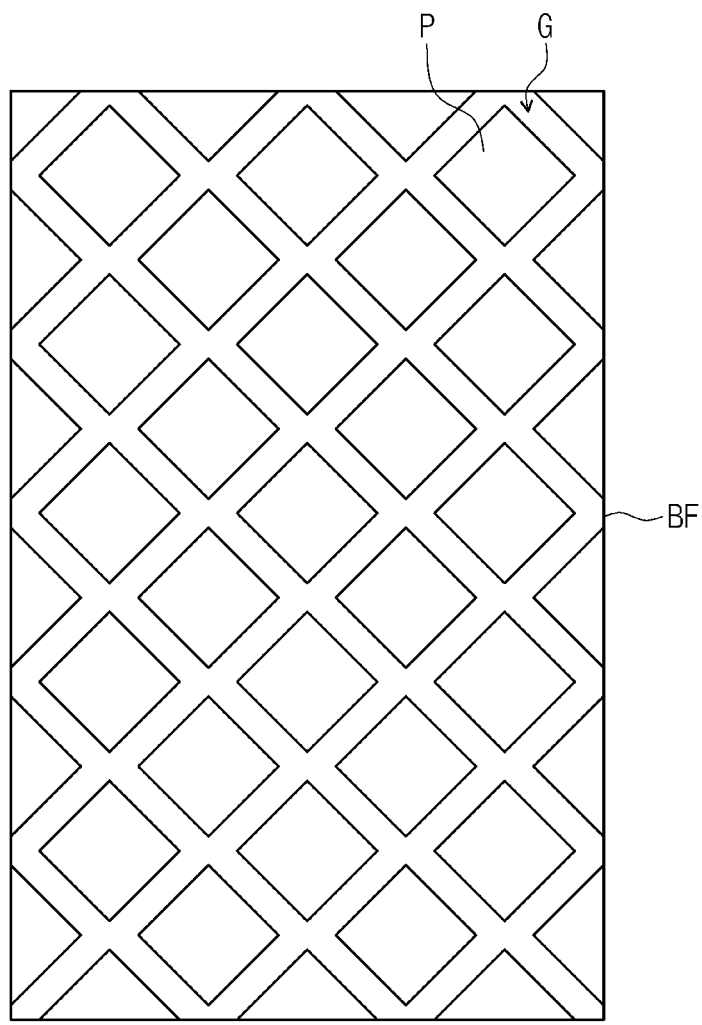

Referring to FIG. 7, each of the protrusions P of the representative base film BF may have a diamond shape in a plan view. The protrusions P disposed at a boundary of the representative base film BF may have a triangular shape in a plan view. In this manner, the protrusions disposed at a boundary may be surrounded by the protrusions P having the diamond shape in a plan view. The groove(s) G may be formed between the protrusions P. Although partial protrusions P are shown disposed at boundaries of the representative base film BF, it is also contemplated that the protrusions P and grooves G may be formed so that whole protrusions P are formed at one or more of the boundaries.

Figure 8:
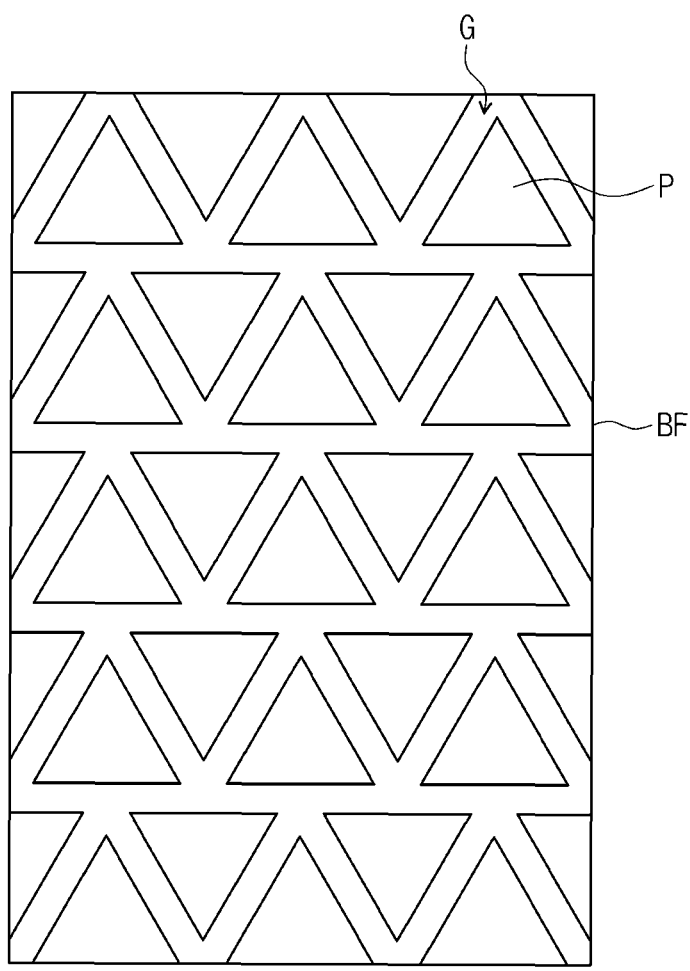

Referring to FIG. 8, each of the protrusions P of the representative base film BF may have a triangular shape in a plan view. In this manner, the direction of adjacent triangular cross-sectional shapes may be alternated in a first direction (e.g., a horizontal direction) and may be similar to one another in a second direction (e.g., a vertical direction). The groove(s) G may be formed between the protrusions P. Although partial protrusions P are shown disposed at boundaries of the representative base film BF, it is also contemplated that the protrusions P and grooves G may be formed so that whole protrusions P are formed at one or more of the boundaries.

Figure 9:
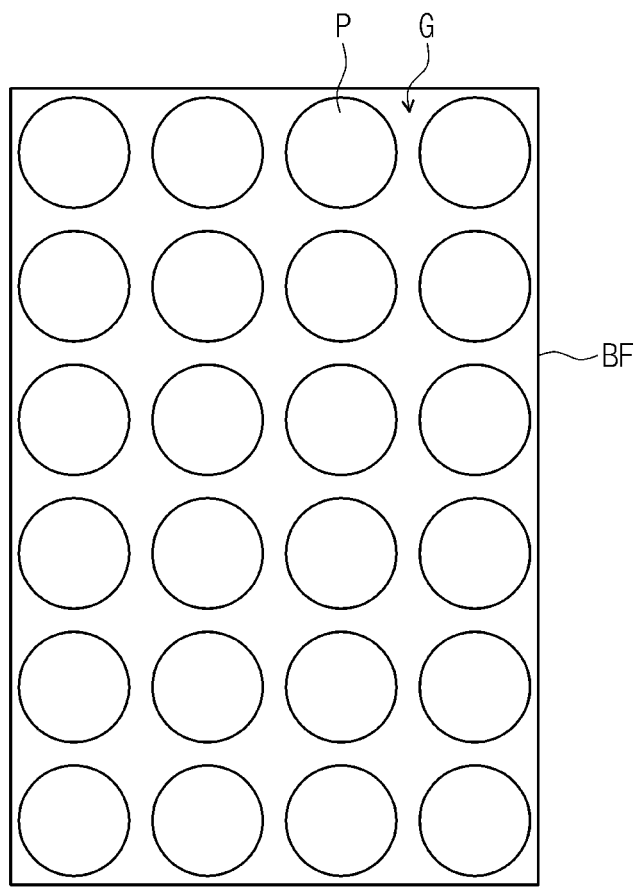

Referring to FIG. 9, each of the protrusions P of the representative base film BF may have a circular shape in a plan view. The groove(s) G may be formed between the protrusions P. Although whole protrusions P are shown disposed at boundaries of the representative base film BF, it is also contemplated that the protrusions P and grooves G may be formed so that partial protrusions P are formed at one or more of the boundaries. In this manner, the partial protrusions P may have a planar side and an arcuate side in a plan view, and may be surrounded by protrusions P having the circular shape in a plan view.

Figure 10:
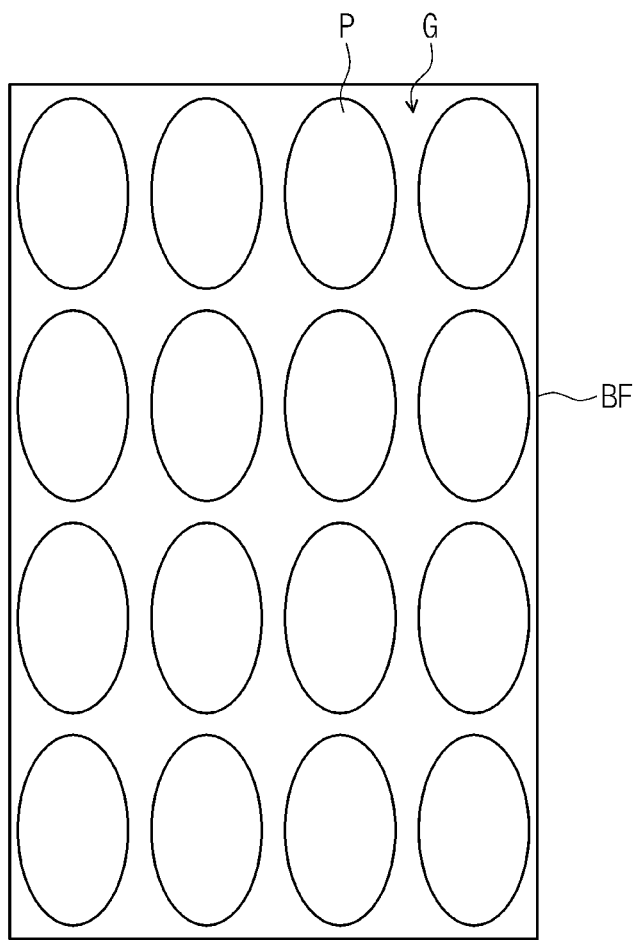

Referring to FIG. 10, each of the protrusions P of the representative base film BF may have an oval shape in a plan view. The groove(s) G may be formed between the protrusions P. Although whole protrusions P are shown disposed at boundaries of the representative base film BF, it is also contemplated that the protrusions P and grooves G may be formed so that partial protrusions P are formed at one or more of the boundaries. In this manner, the partial protrusions P may have a planar side and an arcuate side in a plan view, and may be surrounded by protrusions P having the oval shape in a plan view.

Although FIGS. 6 to 10 show the protrusions P each having the hexagonal shape, the diamond shape, the triangular shape, the circular shape, and the oval shape in a plan view, it is contemplated that any other suitable shape may be utilized. Further, according to exemplary embodiments, the representative base film BF shown in FIGS. 6 to 10 may correspond to one or more of the base films 210, and the base films 210 may be stacked upon one another to form at least a portion of the window member 200. In this manner, the window member 200 and the image display apparatus 300 including the window member 200 may include one or more base films 210 configured as shown in at least one of FIGS. 6 to 10. To this end, the base films 210 may serve to protect the display panel 100 from external forces and at least maintain the flexibility of the base films 210.

Figure 11A:
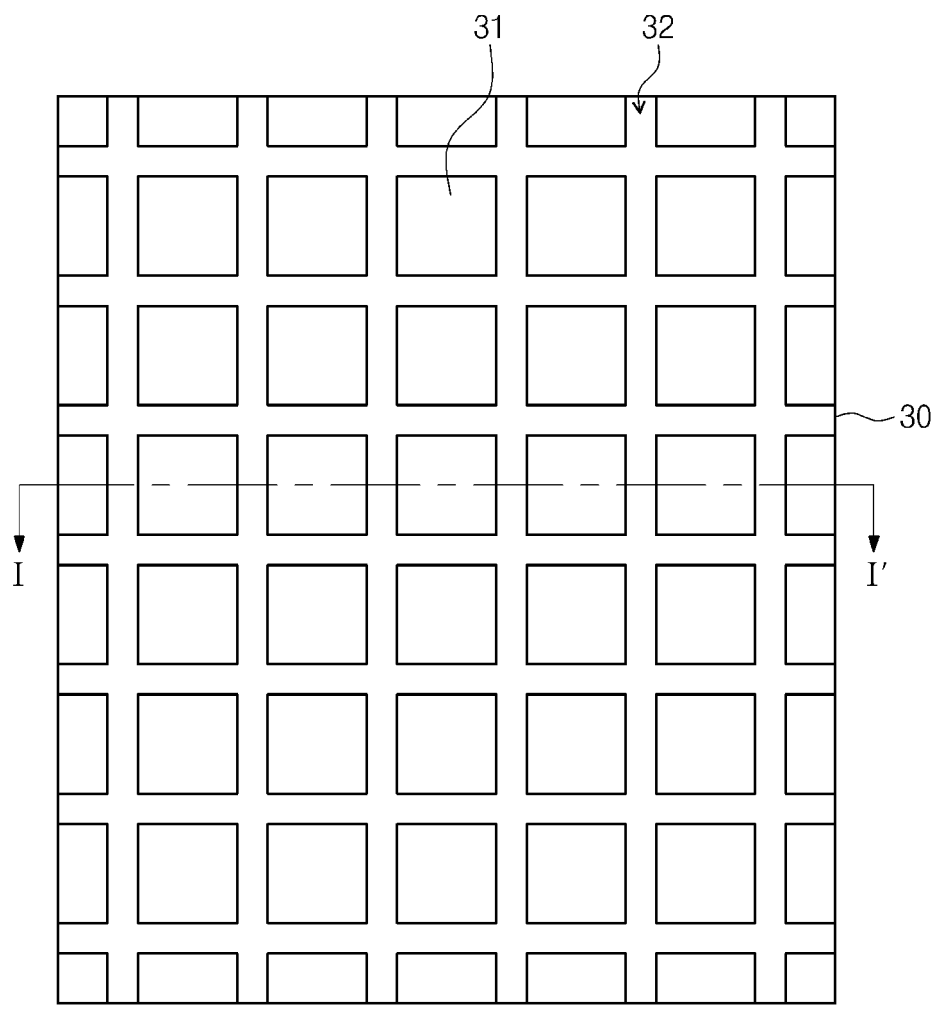
FIGS. 11A to 11D are views of a base film at various stages of manufacture, according to exemplary embodiments.
Figure 11B:
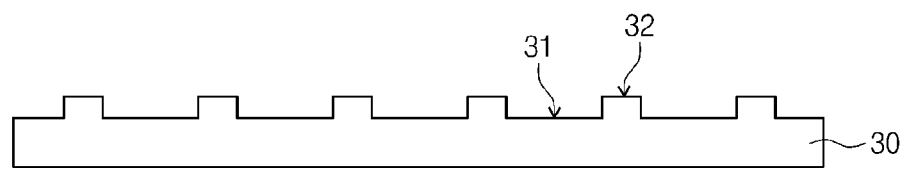
Figure 11C:
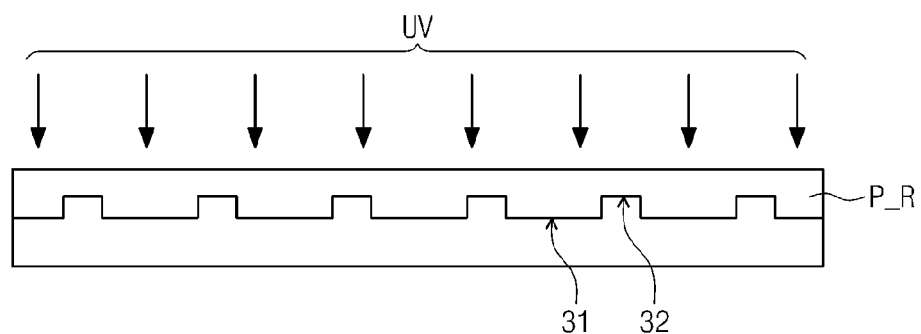
Figure 11D:
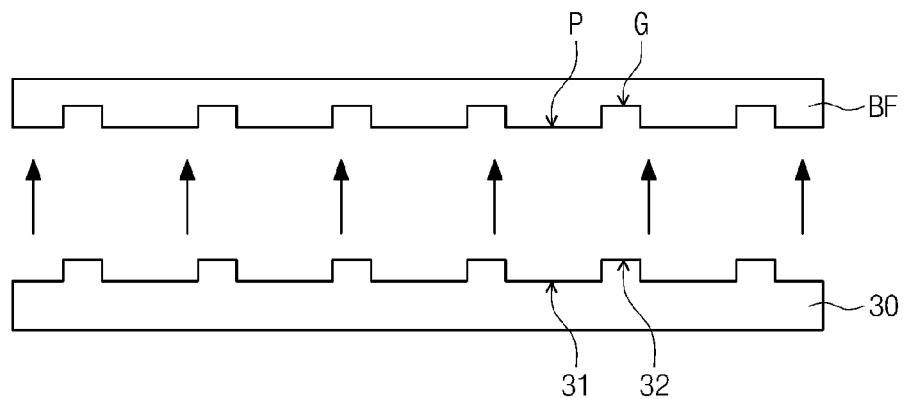

FIGS. 11A to 11D are views of various stages of manufacture of a base film, according to exemplary embodiments. It is noted that FIG. 11A is a plan view of a casting substrate 30 that may be utilized to form the base films. FIG. 11B is a cross-sectional view of the casting substrate 30 taken along sectional line I-I'. FIGS. 11C and 11D are respective cross-sectional views illustrating the formation of a base film, according to exemplary embodiments.

With reference to FIGS. 11A to 11D, it is noted that the base films 210 may be fabricated via at least one casting method. As can be appreciated, casting typically involves at least one molding process. That is, a material used for a desired product may be disposed on a molding box, which may be formed with a desired pattern to be formed. The material disposed on the molding box may be separated from the molding box after being cured.

Referring to FIGS. 11A and 11B, the casting substrate 30 may be prepared. The casting substrate 30 may include first grooves 31 and first protrusions 32 disposed between the first grooves 31. The first protrusions 32 may be upwardly protruded from a surface including the first grooves 31. The first grooves 31 of the casting substrate 30 may correspond to the protrusions P of the base film BF and the first protrusions 32 may correspond to the grooves G of the base film BF. Although the first grooves 31 and first protrusions 32 are illustrated with a rectangular shape in a plan view, it is noted that the dimensioning and shapes of the first grooves 31 and first protrusions 32 may be configured in accordance with an intended configuration of the base film BF.

Referring to FIG. 11C, a polymer resin P_R may be disposed on the casting substrate 30. Although not shown, the casting substrate 30 may include a bounding edge configured to prevent the polymer resin P_R from flowing off the casting substrate 30. To this end, the polymer resin P_R may be disposed on the casting substrate 30 using a nozzle (not illustrated). It is noted that the polymer resin P_R may be a polyimide (PI) resin, a poly(methyl methacrylate) (PMMA) resin, a tri-acetyl-cellulose (TAC) resin, etc. It is also noted that one or more constituent components of an intended material may be disposed on the casting substrate 30 using one or more nozzles (not shown). In this manner, the one or more constituent components may mix and/or form the polymer resin P_R when disposed on the casting substrate 30 or may form the polymer resin P_R during a curing process. As such, the polymer resin P_R provided on the casting substrate 30 may be cured by ultraviolet light/rays UV.

Referring to FIG. 11D, the cured polymer resin P-R may be separated from the casting substrate 30. In this manner, the base film BF may be manufactured. It is contemplated, however, that any other suitable process may be utilized. As seen in FIG. 11D, however, the protrusions P of the base film BF are formed based on the configuration of the first grooves 31 of the casting substrate 30 and the grooves G of the base film BF are formed based on the configuration of the first protrusions 32 of the casting substrate 30. One or more manufactured base films may be stacked upon one another to form at least a portion of the window member 200. In this manner, the protective film 220 may be formed on at least one of the base films BF.

According to exemplary embodiments, the window member 200 and the image display apparatus 300 including the window member 200 may protect the display panel 100 from external forces and at least maintain the flexibility of the base films BF.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:
1. A display apparatus, comprising:
   a display panel comprising:
      a first area to display an image; and
      a second area disposed outside the first area;
   a window member disposed on the display panel, the window member comprising:
      flexible base films stacked in direct contact with one another, each flexible base film being substantially transparent; and
      a protective film disposed on the flexible base films, the protective film being substantially transparent; and
   a decorative printed layer disposed in association with the second area between the window member and the display panel, the decorative printed layer being in direct contact with a flexible base film disposed closest to the display panel of the flexible base films,
   wherein:
      each of the flexible base films comprises protrusions and grooves disposed between adjacent protrusions; and
      corresponding protrusions of the flexible base films at least partially overlap one another.

2. The display apparatus of claim 1, wherein the at least some of the flexible base films comprise at least one of polyimide, poly(methyl methacrylate), and tri-acetyl-cellulose.

3. The display apparatus of claim 1, wherein, for each flexible base film, a ratio of a first dimension between a bottom surface thereof and a bottom surface of the grooves to a second dimension between the bottom surface of the grooves and an upper surface of the protrusions to a third dimension between lateral edges of each protrusion to a fourth dimension between lateral edges of each groove is 1.00:0.25~0.50:1.00~5.00:0.50~1.50.

4. The display apparatus of claim 3, wherein, for each flexible base film:
the first dimension is greater than or equal to about 50 micrometers and smaller than a fifth dimension between the bottom surface thereof and the upper surface of the protrusions; and
the fifth dimension is smaller than or equal to about 200 micrometers.

5. The display apparatus of claim 1, further comprising:
an adhesive disposed between the display panel and the window member,
wherein the adhesive couples the display panel to the decorative printed layer and the window member.

6. The image display apparatus of claim 1, wherein at least some of the protrusions, in a plan view, form a rectangular shape, a hexagonal shape, a diamond shape, a triangular shape, a circular shape, or an oval shape.

7. A display apparatus, comprising:
a display panel comprising:
a first area to display an image; and
a second area disposed outside the first area;
a stack of flexible films in direct contact with one another and disposed on the display panel, each of the flexible films comprising a main portion and a pattern of protrusions extending from the main portion;
a protective film disposed on the stack of flexible films; and
a decorative layer disposed in association with the second area between the display panel and the stack of flexible films, the decorative layer being in direct contact with a flexible film disposed closest to the display panel of the stack of flexible films,
wherein the respective patterns of protrusions substantially overlap one another.

8. The display apparatus of claim 7, wherein at least one of the flexible films comprises at least one of polyimide, poly (methyl methacrylate), and tri-acetyl-cellulose.

9. The display apparatus of claim 7, wherein a ratio between four dimensions of at least one of the flexible films is 1.00:0.25~0.50:1.00~5.00:0.50~1.50.

10. The display apparatus of claim 9, wherein:
a first of the four dimensions corresponds to a height of the main portion;
a second of the four dimensions corresponds to a protrusion height;
a third of the four dimensions corresponds to a protrusion width; and
a fourth of the four dimensions corresponds to a pitch between adjacent protrusions.

11. The display apparatus of claim 10, wherein:
the height of the main portion is greater than or equal to about 50 micrometers; and
the sum of the height of the main portion and the protrusion height is smaller than or equal to about 200 micrometers.

12. The display apparatus of claim 7, further comprising:
an adhesive layer coupling the display panel and the stack of flexible films together,
wherein the decorative layer partially overlaps the adhesive layer, the decorative layer being disposed between the stack of flexible films and the adhesive layer.

13. The display apparatus of claim 12, wherein the decorative layer partially overlaps the adhesive layer in the second area.

14. The display apparatus of claim 7, wherein each of the protrusions, in a plan view, form a rectangular shape, a hexagonal shape, a diamond shape, a triangular shape, a circular shape, or an oval shape.

15. The display apparatus of claim 7, wherein each of the stack of flexible films and the protective film is substantially transparent.

* * * * *